United States Patent [19]

Tahara et al.

[11] 4,368,988

[45] Jan. 18, 1983

[54] ELECTRONIC TIMEPIECE HAVING RECORDING FUNCTION

[75] Inventors: Iwao Tahara, Higashiyamato; Toshiharu Aihara, Kodaira; Naoki Takahashi, Fussa; Yushin Matsuo, Chofu, all of Japan; Takuo Wakabayashi, deceased, late of Saitama, Japan; by Shigemasa Wakabayashi, legal representative, Nagano, Japan

[73] Assignee: Casio Computer Co., Ltd., Tokyo, Japan

[21] Appl. No.: 212,499

[22] Filed: Dec. 3, 1980

[30] Foreign Application Priority Data

Dec. 12, 1979 [JP] Japan ................................ 54-161814
Dec. 25, 1979 [JP] Japan ................................ 54-168733

[51] Int. Cl.[3] ........................ G04B 21/08; G11C 13/00

[52] U.S. Cl. ........................................ 368/63; 368/251; 179/1 SM; 360/32; 365/45

[58] Field of Search ................. 368/10, 62, 63, 72-75, 368/245, 250, 251, 261; 364/900, 705, 710; 179/1 SA, 1 SM; 360/32; 365/45

[56] References Cited

U.S. PATENT DOCUMENTS

| | | | |
|---|---|---|---|
| 3,919,834 | 11/1975 | Murakami et al. | 368/63 |
| 4,104,865 | 8/1978 | Sasaki | 368/261 |
| 4,117,542 | 9/1978 | Klausner et al. | 364/900 |
| 4,318,188 | 3/1982 | Hoffman | 365/45 |

*Primary Examiner*—Vit W. Miska
*Attorney, Agent, or Firm*—Frishauf, Holtz, Goodman and Woodward

[57] ABSTRACT

An electronic timepiece has a plurality of alarm time memory circuits in a semiconductor memory means for memorizing different alarm times and a memory for memorizing voice data of messages telling for example what has to be done at alarm times memorized in the respective alarm time circuits.

The voice data memorized in the memory are obtained through conversion of externally coupled voice signals, and at the arrival of an alarm time the corresponding voice data is read out and coupled to a loudspeaker for reproducing the recorded message voice.

3 Claims, 6 Drawing Figures

ELECTRONIC TIMEPIECE HAVING RECORDING FUNCTION

BACKGROUND OF THE INVENTION

This invention relates to an electronic timepiece having a plurality of alarm functions for different alarm times.

Recent electronic timepieces have been greatly advanced in versatility, and those having alarm functions and timer functions are in use. Regarding the alarm function, it has been in practice to permit a monotone sound at a predetermined frequency or a predetermined piece of music to be produced at the arrival of an alarm time. However, the monotone sound or piece of music produced as the alarm sound is fixed, i.e., predetermined by the manufacturer, so that it sometimes fails to meet the taste of the user or the user is soon bored. Another difficiency is that the alarm sound does not inform of what has to be done at the alarm time, and therefore the user himself or herself has to memorize the scheduled content for which the alarm time is set.

It has been contemplated to record the scheduled content to be done at an alarm time as message, for instance in a tape recorder, and operate the tape recorder to reproduce the recorded voice message at the arrival of an alarm time. However, the provision of the tape recorder increases the size of the device and is impractical.

It has been also contemplated to record a message in a memory within the timepiece by operation of a keyboard or the like and cause the message to be displayed on a display section at the time of arrival of an alarm time. However, this not only requires many operating keys but also the display section has to have a construction capable of displaying characters, for instance a dot matrix construction, which is undesired from the standpoint of the size reduction.

This invention is intended in the light of the above affairs, and it has an object of providing an electronic timepiece having a plurality of alarm functions for different alarm times, in which externally coupled voices as messages for different alarm times can be recorded and reproduced at the time of the corresponding alarm actions so that the user can hear the given messages at the corresponding alarm times.

It is another object of the invention to provide an electronic timepiece, which permits recording of a comparatively long voice message as well as a short voice message without need of unnecessarily increasing the memory capacity.

SUMMARY OF THE INVENTION

To achieve the above objectives, the invention provides an electronic timepiece having a recording function comprising a time counting means for producing time information through the counting of a reference frequency signal, a time display means for displaying the time information produced from the time counting means, an alarm time memory means including a plurality of memory sections for memorizing different alarm times, a semiconductor memory means having a plurality of memory sections each adapted to be selected for cooperation with a desired one of the memory section of the alarm time memory means, said memory sections of the semiconductor memory means being each capable of memorizing voice data of an externally coupled voice, and a voice reproducing means for reading out voice data memorized in one of the memory sections in the semiconductor memory means and reproducing the corresponding recorded voice when the time information obtained from the time counting means coincides with an alarm time memorized in a corresponding one of the memory sections in the alarm time memory means.

According to the invention, it is possible to incorporate a recording function in a small-size timepiece such as a wristwatch and also permit the user to be informed of what has to be done at an alarm time by the reproduced message voice. Thus, it is possible to provide an electronic timepiece which is very useful and convenient.

DETAILED DESCRIPTION

Figure 1:
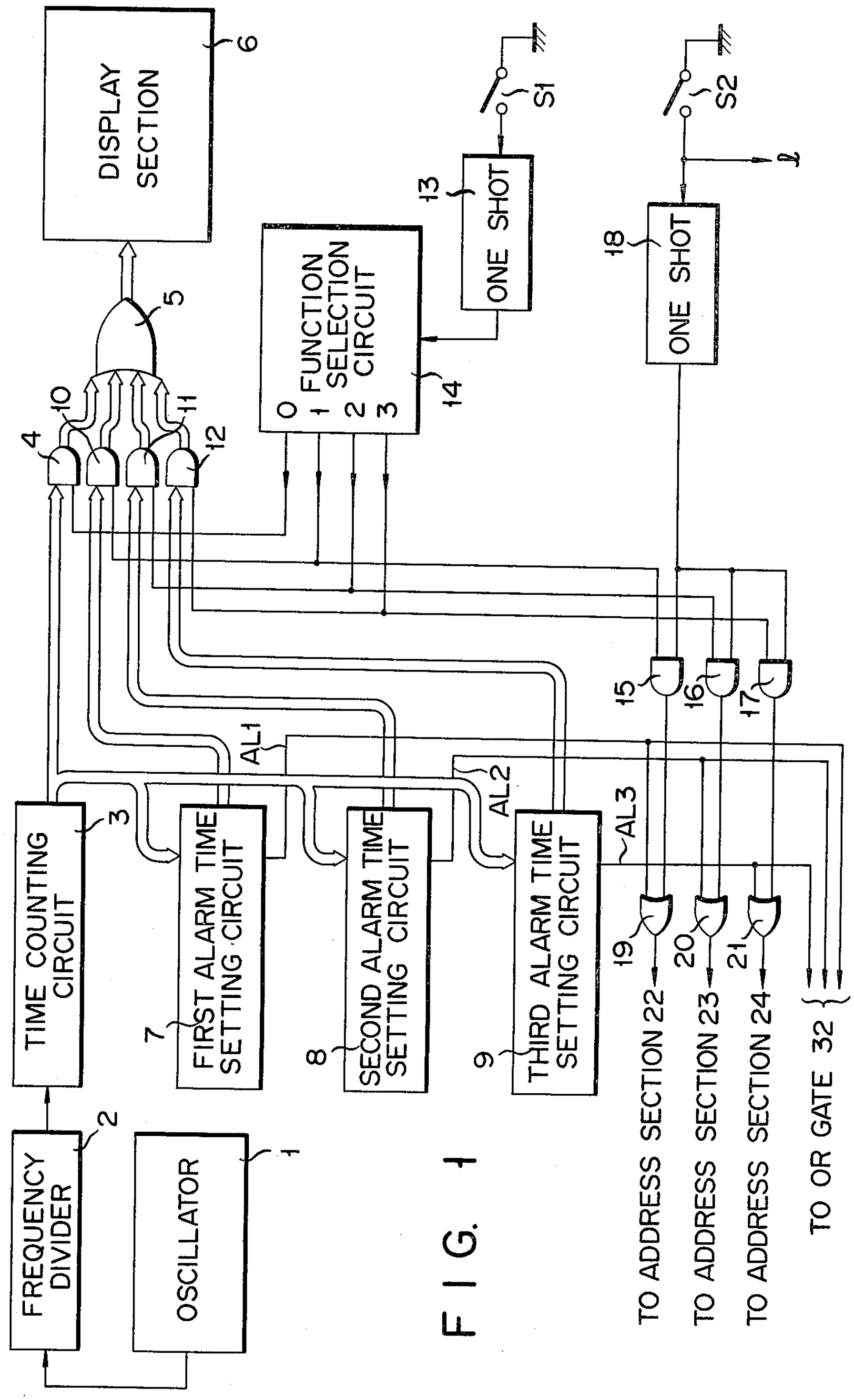
FIG. 1 is a view showing part of the circuit construction of one embodiment of the electronic timepiece according to the invention.

FIG. 1 shows the circuit construction of an electronic timepiece embodying the invention. Reference numeral 1 designates an oscillator for producing a reference clock signal, 2 a frequency divider for dividing the reference clock signal to produce a signal having a period of one-second, and 3 a time counting circuit for providing time information and calendar information on the basis of the counting of the one-second period signal mentioned above. The time information obtained from the time counter circuit 3 is coupled through an AND gate and an OR gate 5 to a liquid crystal display section 6 and optically displayed therein. Of the time data obtained from the time counting circuit 3, hour and minute data are also supplied to first to third alarm time setting circuits 7 to 9. In these alarm time setting circuits 7 to 9, desired alarm times are preset through the operation of manual switches (not shown). The alarm time setting circuits 7 to 9 detect the coincidence of their preset alarm time data and the time information from the time counting circuit 3 and, when the coincidence is detected, produce respective alarm signals $AL_1$ to $AL_3$. The present alarm time data in the alarm time setting circuits 7 to 9 are coupled through respectively corresponding AND gates 10 to 12 and the OR gate 5 to the display section 6 and optically displayed therein.

Designated at $S_1$ is a function selection switch. When this switch $S_1$ is operated, an output signal produced therefrom is coupled to a one-shot circuit 13, causing the circuit 13 to produce a one-shot pulse signal. This pulse signal is coupled to a function selection circuit 14 consisting of a 4-step counter to cause increase of the counter value by one step. More particularly, the function selection circuit 14 counts the pulse signal output of the one-shot circuit 13 and produces "0" to "3" count signals respectively corresponding to its progressively increasing count values "0" to "3". These "0" to "3" count signals are coupled as gate control signal to the respective AND gates 4 and 10 to 12 for selecting the data displayed in the display section 6. The "1" to "3" count signals from the function selection circuit 14 are also coupled as gate control signal to respective AND gates 15 to 17. Designated at $S_2$ is a recording switch. When this switch $S_2$ is operated, an output signal produced therefrom is coupled to an A/D analog/digital) converter 29 and an encoder 30 shown in FIG. 2, while it is also coupled to a one-shot circuit 18, causing the circuit 18 to produce a one-shot pulse signal. This pulse signal is coupled to the AND gates 15 to 17, and a one-shot pulse output from each of the AND gates 15 to 17 is coupled through a corresponding one of OR gates 19 to 21 to a corresponding one of address sections 22 to 24. The alarm signals $AL_1$ to $AL_3$ produced from the alarm time setting circuits 7 to 9 are coupled to the respective OR gates 19 to 21 mentioned above, and also they are coupled to an OR gate 32 shown in FIG. 2.

Figure 2:
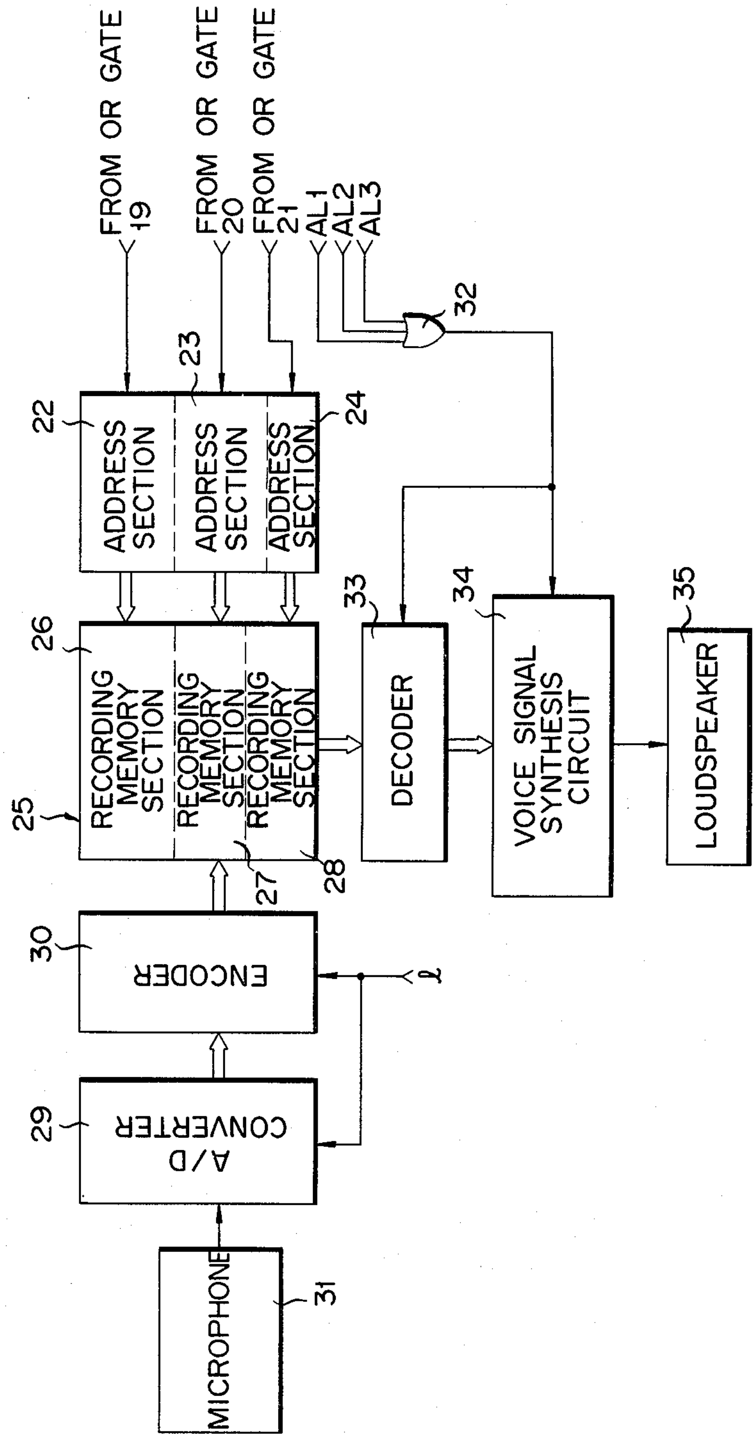
FIG. 2 is a view showing the other part of the circuit construction than that shown in FIG. 1.

Referring to FIG. 2, the output signals from the OR gates 19 to 21 shown in FIG. 1 are coupled to the respective address sections 22 to 24. Address data provided from the address sections 22 to 24 are supplied to a recording memory 25. The recording memory 25 uses a semiconductor memory and is constructed as a RAM (random access memory). It consists of three recording memory sections 26 to 28 individually corresponding to the respective first to third alarm time setting circuits 26 to 28. These recording memory sections 26 to 28 are constructed such that their memory capacity proportions are roughly 3:2:1. In terms of the time, these recording memory sections 26 to 28 are capable of recording for about 9 seconds, about 6 seconds and about 3 seconds respectively. In these recording memory sections 26 to 28, their addresses are specified from the first address to the last by address data from the respective address sections 22 to 24.

The output signal of the recording switch $S_2$ is also coupled as operation command signal l to the A/D converter 29 and encoder 30. The A/D converter 29 converts an analog voice signal coupled from a microphone 31 into a digital voice signal coupled to the encoder 30. The encoder 30 encodes the digital voice signal input to produce data representing the tone, volume, etc. The voice data produced from the encoder 30 is supplied to the recording memory 25 and is written, i.e., recorded, in that one of the three recording memory sections 26 to 28 in which the first address is specified.

The alarm signals $AL_1$ to $AL_3$ are coupled through the respective AND gates 19 to 21 to the address sections 22 to 24 to let these sections to produce address data, while they are also coupled as operation command signal through the OR gate 32 to a decoder 33 and a voice synthesis signal circuit 34. When one of the alarm signals $AL_1$ to $AL_3$ appears, the voice data stored in a corresponding one of the recording memory sections 26 to 28 in the recording memory 25 is read out in the same order as when it is written, and is coupled to the decoder 33. The operation of the decoder 33 is converse to that of the encoder 30 mentioned above. The decoded data from the decoder 33 is coupled to the voice signal synthesis circuit 34. The voice signal synthesis circuit 34 synthesizes voice signal from the decoded data input to it, and the voice signal thus produced is coupled to a loudspeaker 35, whereby the voice is reproduced.

Now, the operation of the electronic timepiece having the construction shown in FIGS. 1 and 2 will be described. For obtaining the display of various time data on the display section 6, the content of the function selection circuit 14 is set to "0" by operating the switch $S_1$. With the "0" count signal thus produced from the function selection circuit 14, the AND gate 4 is opened. Thus, the time information obtained from the time counting circuit 3 is coupled through the AND gate 4 and OR gate 5 to the display section 6 and optically displayed as present time data either by digital or analog display. When the content of the function selection circuit 14 is set to "1" by operating the switch $S_1$, the AND gate 10 is opened by the "1" count signal produced from the function selection circuit 14, so that the alarm time data preset in the first alarm time setting circuit 7 is optically displayed either by digital or analog display. Likewise, when the content of the function selection circuit 14 is set to "2" by operating the switch $S_1$ to produce the "2" count signal, the alarm time data preset in the second alarm time setting circuit 8 is displayed, and when the content of the function selection circuit 14 is set to "3" by operating the switch $S_1$ to produce the "3" count signal, the alarm time data preset in the third alarm time setting circuit 8 is displayed.

Now, the operation of recording alarm time voices or messages, for instance words "phone" for 9 o'clock and 39 minutes a.m., "waiting for Mr. A for meeting" for 10 o'clock flat a.m. and "prearrangements" for 4 o'clock flat p.m., will be described. As mentioned earlier, the memory capacity of the recording memory selection 26 corresponding to the first alarm time setting circuit 7 is the greatest, that of the recording memory section 27 corresponding to the second alarm time setting circuit 8 is the next, and that of the recording memory section 28 corresponding to the third alarm time setting circuit 9 is the least. Accordingly, the first alarm time setting circuit 7 is used to record "waiting for Mr. A for meeting" as the alarm time message for 10 o'clock flat a.m., the second alarm time setting circuit 8 is used to record "prearrangements" for 4 o'clock flat p.m., and the third alarm time setting circuit 9 is used to record "phone" for 9 o'clock and 30 minutes a.m. In the state in which the content of the function selection circuit 14 is set to "1" so that the alarm time data preset in the first alarm time setting circuit 7, namely "10:30 a.m.", is displayed on the display section 6, the AND gate 15 is held open by the "1" count signal from the function selection circuit 14. In this state, by operating the switch $S_2$ the output signal therefrom is coupled to the one-shot circuit 18 to cause the circuit 18 to produce a one-shot pulse signal, which is coupled through the AND gate 15 and OR gate 18 to the address section 22 to cause the section 22 to provide first address data specifying the first address in the recording memory section 26 of the recording memory 25. The output signal of the switch $S_2$ is also coupled as the operation command signal l to the A/D converter 29 and encoder 30, that is, the A/D converter 29 and encoder 30 are held operative so long as the switch $S_2$ is being operated. The alarm time words "waiting for Mr. A for meeting" informing of the alarm time of 10 o'clock flat a.m. are correctly pronounced in this state to the microphone 31. By so doing, the voice signal coupled from the microphone 31 is converted through the A/D converter into a corresponding digital voice signal and then encoded through the encoder 30, and the output therefrom is written in the recording memory section 26 of the recording memory 25. In this way, the voice information "waiting for Mr. A for meeting" is recorded in the recording memory section 26 of the recording memory 25. In the state in which the content of the function selection circuit 14 is set to "2" so that the alarm time data preset in the second alarm time setting circuit 8, namely "4:00 p.m.", is displayed on the display section 6, the AND gate 16 is held open by the "2" count signal from the function selection circuit 14. Likewise, in the state in which the content of the function selection circuit 14 is set to "3" so that the alarm time data preset in the third alarm time setting circuit 9, namely "9:30 a.m.", is displayed on the display section 6, the AND gate 17 is held open by the "3" count signal from the function selection circuit 14. In the state with the content of the function selection circuit 14 set to "2", by operating the switch $S_2$ the output signal therefrom is coupled to the one-shot circuit 18 to cause the circuit 18 to produce a one-shot pulse signal, which is coupled through the AND gate 16 and OR gate 20 to the address section 23 to cause the section 23 to produce first address data specifying the first address in the recording memory section 27. Likewise, in the state with the content function selection circuit 14 set to "3", by operating the switch $S_2$ the output signal therefrom is coupled to the one-shot circuit 18 to cause the circuit 18 to produce a one-shot pulse signal, which is coupled through the AND gate 17 and OR gate 21 to the address section 24 to cause the section 23 to produce first address data specifying the first address in the recording memory section 28. Since the A/D converter 29 and encoder 30 are held operative so along as the switch $S_2$ is being operated, in the state of display of the alarm time data "4:00 p.m." the word "prearrangements" informing of the alarm time of 4 o'clock flat p.m. is spoken to the microphone 31, whereby the this word is recorded in the recording memory section 27. Likewise, in the state of display of the alarm time data "9:30 a.m." the word "phone" informing of the alarm time of 9 o'clock and 30 minutes a.m. is spoken to the microphone 31, wherein the this word is recorded in the recording memory section 28.

In the above way, the longest message "waiting for Mr. A for meeting" as the alarm time words is recorded in the recording memory section 26 having the greatest memory capacity, the next longest message "prearrangements" is recorded in the recording memory section 27 having the next greatest memory capacity, and the shortest message "phone" is recorded in the recording memory section 28 having the least memory capacity.

When the alarm time "9:30 p.m." is reached, the alarm signal $AL_3$ is produced from the third alarm setting circuit 9 and coupled through the OR gate 21 to the address section 24 to cause the section 24 to specify addresses in the recording memory section 28, while it is also coupled to the decoder 33 and voice signal synthesis circuits 34 to render these circuits operative. As a result, voice data for "phone" recorded in the recording memory section 28 is read out according to the address specification by the address section 24 and decoded in the decoder 33 for coupling to the voice signal synthesis circuit 34 to reproduce the voice signal, whereby the recorded voice is reproduced from the loudspeaker 35. Thus, the user can hear the reproduced voice "phone" as alarm sound at 9 o'clock and 30 minutes a.m. Likewise, when the alarm time "10:00 a.m." is reached, the alarm signal $AL_2$ is produced from the first alarm time setting circuit 7 and coupled through the OR gate 19 to the address section 22 to cause the section 22 to produce address data. As a result, voice data for "waiting for Mr. A for meeting" recorded in the recording memory section 26 is read out according to the address specification by the address section 22 and reproduced from the loudspeaker. Further, when the alarm time "4:00 p.m." is reached, the alarm signal $AL_2$ is produced from the second alarm time setting circuit 8 and coupled through the OR gate 20 to the address section 23 to cause the section 23 to produce address data. As a result, voice data for "prearrangements" recorded in the recording memory section 27 is read out and reproduced from the loudspeaker.

It is to be appreciated that at the arrival of an alarm time the recorded content for that time is reproduced as alarm sound, so that what is scheduled for that time can be known from the alarm sound.

Figure 3:
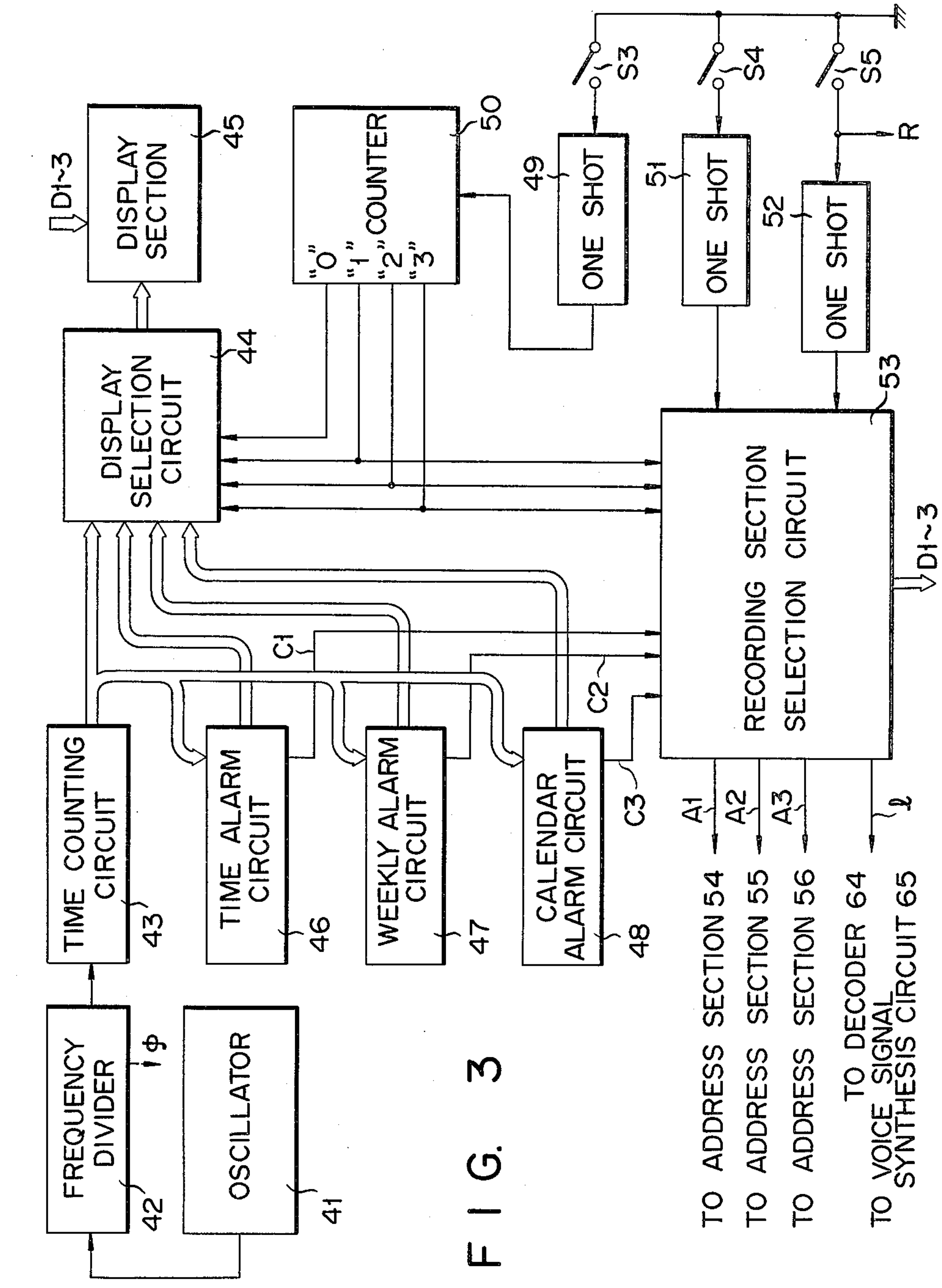
FIG. 3 is a view showing part of the circuit construction of a different embodiment of the electronic timepiece according to the invention.

FIG. 3 shows the circuit construction of a different embodiment of the electronic timepiece according to the invention. Reference numeral 41 designates an oscillator for producing a reference clock signal, 42 a frequency divider for dividing the reference clock signal to produce a signal having a period of one second, and 43 a time counting circuit for producing time information on the basis of the counting of one-second period signal mentioned above. The time information obtained from the time counter circuit 43 is coupled through a display selection circuit to a liquid crystal display section 45 and digitally displayed therein. It is also coupled to a time alarm circuit 46, in which preset hour and minute data are memorized, to a weekly alarm circuit 47, in which preset weekday, hour and minute data are memorized, and to a calendar alarm circuit 48, in which preset data, hour and minute data are memorized. These alarm circuits 46 to 48 detect the coincidence of their preset data and the time information from the time counting circuit 43 and, when the coincidence is detected, produce respective alarm signals $C_1$ to $C_3$ each consisting of a one-shot pulse. The preset data memorized in the alarm circuits 46 to 48 are coupled through the display selection circuit 44 to the display section 45 for digital display.

Designated at $S_3$ is a display selection switch. When this switch $S_3$ is operated, an output signal produced therefrom is coupled through a one-shot circuit 49 to a 4-step display selection counter 50 to cause increase of the counter value by one step. More particularly, the display selection counter 50 counts the pulse signal output of the one-shot circuit 49 and produces "0" to "3" count signals respectively corresponding to its progressively increasing count values "0" to "3". These "0" to "3" count signals are coupled as respective display selection circuit 44 for selecting data displayed in the display section 45. Designated at $S_4$ is a function selection switch, and at $S_5$ a recording switch. When these switches $S_4$ and $S_5$ are operated, output signals therefrom are coupled through respective one-shot circuits 51 and 52 to a recording section selection circuit 53, which selects one of a plurality of recording sections having different recording capacities (to be described later). To the recording memory section selection circuit 53 are also coupled the alarm signal $C_1$ from the time alarm circuit 46, the alarm signal $C_2$ from the weekly alarm circuit 47, the alarm signal $C_3$ from the calendar alarm circuit 48 and the "1" to "3" count signals from the display selection circuit 44. The recording memory section selection circuit 53 effects a selecting operation when the pulse signal output of the one-shot circuit 51 and the "1", "2" or "3" count signal of the display selection circuit 50 are coupled to it, and also it produces a signal $A_1$, $A_2$ or $A_3$ when the pulse signal output of the one-shot circuit 52 or one of the alarm signals $C_1$ to $C_3$ from the alarm circuits 46 to 48 is coupled to it, as will be described hereinafter in detail. The signals $A_1$ to $A_3$ are coupled to respective address sections 54 to 56 shown in FIG. 4.

Figure 4:
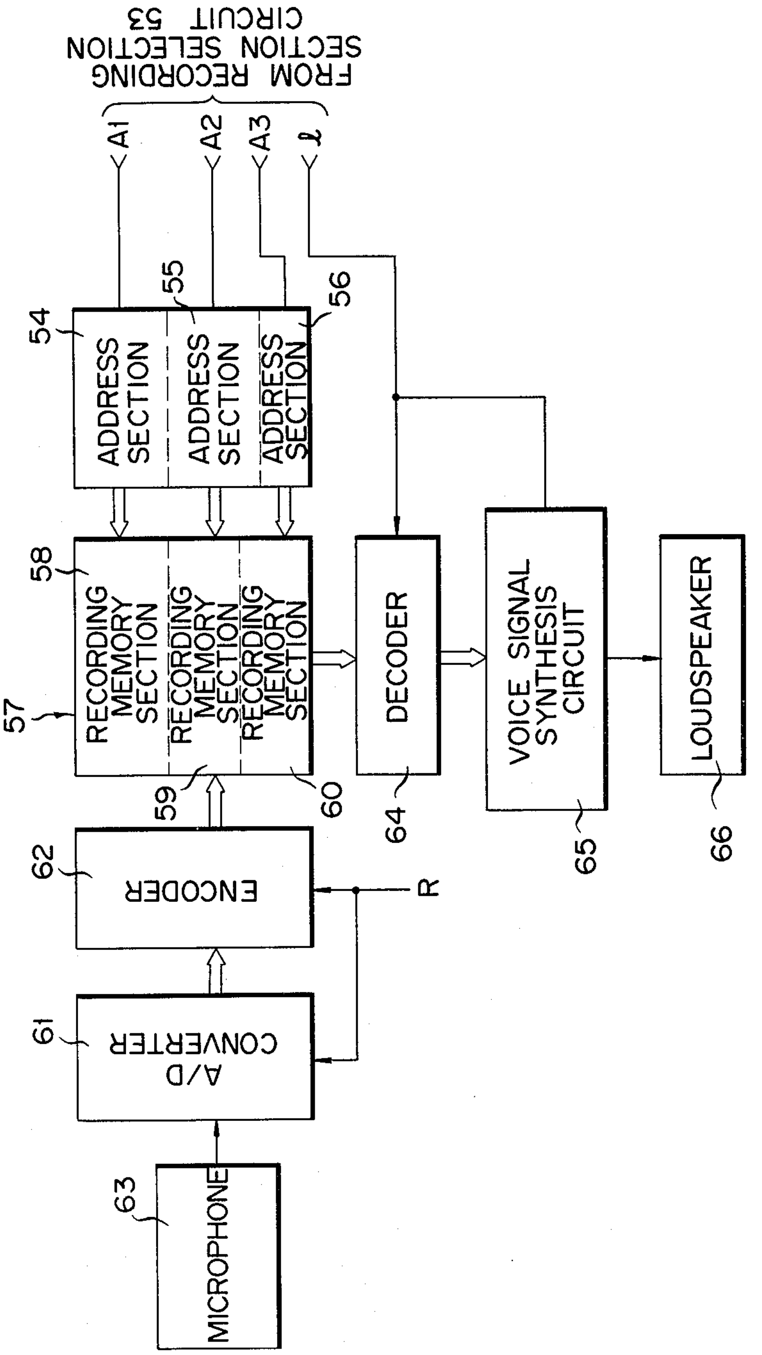
FIG. 4 is a view showing the other part of the circuit construction than that shown in FIG. 3.

Referring to FIG. 4, the signals $A_1$ to $A_3$ coupled from the recording section selection circuit 53 cause the address specifying operation of the respective address sections 54 to 56. Address data produced from the address sections 54 to 56 are supplied to a recording memory 57. The recording memory 57 is constituted by an RAM (random access memory), for instance, and it has three recording memory sections 58 to 60 individually corresponding to the respective address sections 54 to 56. These memory sections 58 to 60 are constructed such that their memory capacity proportions are roughly 3:2:1. In terms of the time, these sections 58 to 60 are capable of recording for about 3 seconds, about 2 seconds and about 1 second respectively. In these recording memory sections 58 to 60, their addresses are specified from the first address to the last by address data from the respective address sections 54 to 56. When one of the signals $A_1$ to $A_3$ is produced, a corresponding one of the recording memory sections 58 to 60 is given address specification from the first address to the last by the associated one of the address sections 14 to 16 for writing or reading operation.

The output signal of the recording switch $S_5$ is also coupled as operation command signal to an A/D (analog/digital) converter 61 and an encoder 62. The A/D converter 61 converts an analog voice signal coupled from a microphone 63 into a digital voice signal coupled to the encoder 62. The encoder 62 encodes the digital voice signal input to produce voice data which is supplied to the recording memory section 57 and written in one of the three recording memory sections 58 to 60 that is under address specification by a corresponding one of the address sections 54 to 56.

When the recording section selection circuit 53 receives the alarm signal $C_1$ from the time alarm circuit 46, the alarm signal $C_2$ from the weekly alarm circuit 47 or the alarm signal $C_3$ from the calendar alarm circuit 48, it supplies a read command signal l to a decoder 64 and a voice signal synthesis circuit 65. The decoder 64 operates in the converse way to the operation of the encoder 62, that is, it decodes the voice data read out from one of the recording memory sections 58 to 60 in the recording memory 57. The decoded data from the decoder 64 is coupled to the voice signal synthesis circuit 65. The voice signal synthesis circuit 65 synthesizes voice signals from the decoded data output from the decoder 64, and the voice signal thus produced is coupled to a loudspeaker 66, whereby the voice is reproduced.

Figure 5:
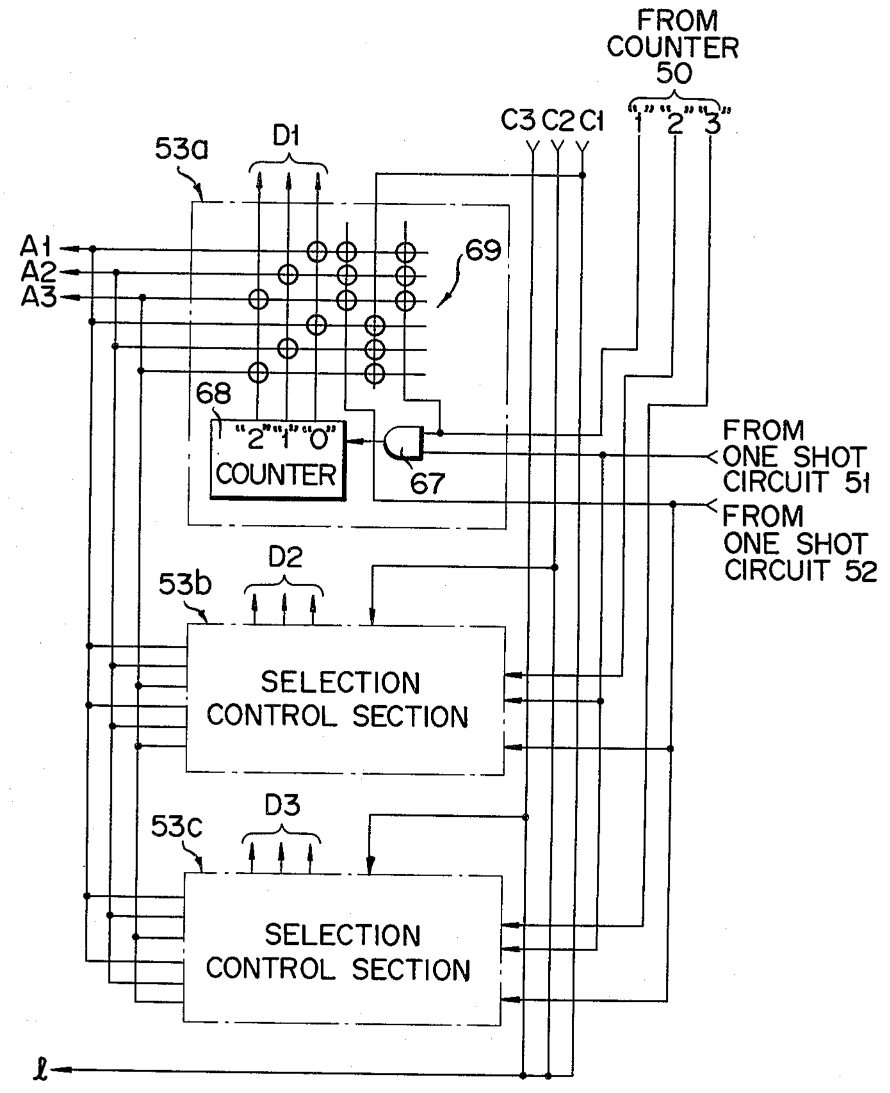
FIG. 5 is a connection diagram showing a recording memory section selection circuit in the embodiment of FIG. 3.

FIG. 5 shows the circuit construction of the recording section selection circuit 53 in detail. As is shown, this circuit includes a selection control section **53*a* for the time alarm circuit 46, a selection control section 53*b* for the weekly alarm circuit 47 and a selection control section 53*c* for the calendar alarm section 48. These selection control sections 53*a* to 53*c* have the same construction, so only the construction of the selection control section 52*a* is shown in detail. In the selection control section 52*a*, the one-shot pulse signal produced from the one-shot circuit 51 with the operation of the selection switch $S_4$ is coupled through an AND gate 67, to which the "1" count signal from the display selection counter 50 is coupled as gate control signal, to a 3-step counter 68 to cause stepwise increase of the content thereof. The 3-step counter 68 produces "0" to "2" count signals which are coupled to a decoder 69. To the decoder 69 are also coupled the one-shot pulse signal, which is produced from the one-shot circuit 52 with the operation of the recording switch $S_5$, the "1" count signal from the display selection counter 50 and the alarm signal $C_1$ from the time alarm circuit 46. In the presence of the "1" signal from the display selection counter 50, the decoder 69 produces the selection signal $A_1$ with the operation of the selection switch $S_5$ when the 3-step counter 68 is producing the "0" count signal, produces the selection signal $A_2$ with the operation of the switch $S_5$ when the 3-step counter 68 is producing the "1" count signal, and produces the selection signal $A_3$ with the operation of the switch $S_5$ when the 3-step counter 68 is producing the "2" count signal. Also, it produces the selection signal $A_1$ when the alarm signal $C_1$ from the time alarm circuit 46 is coupled in the presence of the "0" count signal from the counter 68, produces the selection signal $A_2$ when the alarm signal $C_1$ is coupled in the presence of the "1" count signal from the counter 68, and produces the selection signal $A_3$ when the alarm signal $C_1$ is coupled in the presence of the "2" count signal from the counter 68. The selection control sections 53*b* and 53*c* are similarly given the one-shot pulse signals from the one-shot circuits 51 and 52. The selection control section 53*b* is also given the alarm signal $C_2$ from the weekly alarm circuit 47 and the "2" count signal from the display selection counter 50 and functions for the weekly alarm circuit 47. The selection control section 53*c* is also given the alarm signal $C_3$ from the calendar alarm circuit 48 and the "3" count signal from the display selection counter 50 and functions for the calendar alarm circuit 48. The "0" to "2" count signals produced from the 3-step counter 58, collectively labeled $D_1$ as signal from the selection control section 53*a*, $D_2$ as signal from the selection control section 53*b* and $D_3$ as signal from the selection control section 53*c*, are also coupled to the display section 45** for display therein.

Figure 6:
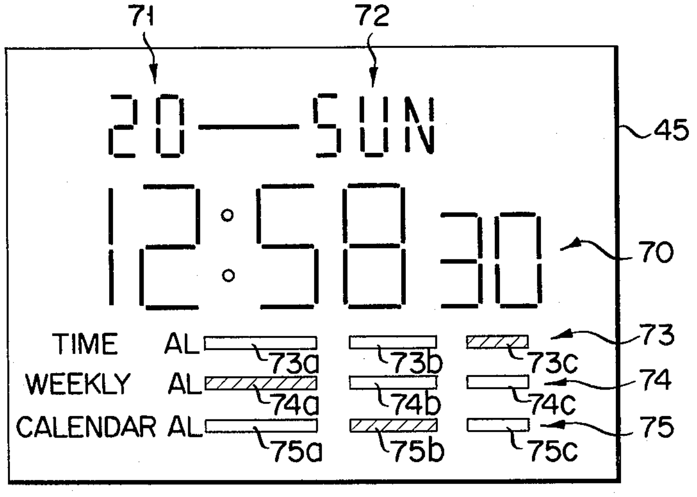
FIG. 6 is a view showing a display state of a display section in the embodiment of FIG. 3.

FIG. 6 shows the construction of the display section 45 in detail. As is shown, this section includes a 6-digit time display section 70 for displaying hour, minute and second data a 2-digit date display section 71 for displaying the date data, and a weekday display section 72 for displaying weekdays in their English abbreviations. It also includes a recording capacity display section 73 for the time alarm circuit 46, a recording capacity display section 74 for the weekly alarm circuit 47 and a recording capacity display section 75 for the calendar alarm circuit 48. These recording capacity display sections 58 to 60 individually have three bar-like display elements **73*a* to 73*c*, 74*a* to 74*c* and 75*a* to 75*c*. The display elements of each section have lengths in proportions 3:2:1 corresponding to recording capacities and are arranged in a row one after the next longer one from the left end. The display elements 73*a* to 73*c* of the recording capacity display section 73 are driven for display according to the signal $D_1$ from the selection control section 53*a*, the display elements 74*a* to 74*c* of the recording capacity display section 74 are driven for display by the signal $D_2$ from the selection control section 53*b*, and the display elements 75*a* to 75*c* of the recording capacity display section 75 are driven for display by the signal $D_3$ from the selection control section 53***c*. The recording capacity display section 73 is labeled "Time AL", these characters being provided by means of printing near one end of it and indicating that it corresponds to the time alarm circuit 46. Likewise, the recording capacity display section 74 is labeled "Weekly AL" indicating that it corresponds to the weekday alarm circuit 47, and the recording capacity display section 75 is labeled "Calendar AL" indicating that it corresponds to the calendar alarm circuit 48.

Now, the operation of the electronic timepiece having the above construction will be described. When the content of the display selection counter 50 is set to "0" by operation of the switch $S_3$, the "0" count signal is supplied from the display selection counter 50 to the display selection circuit 44. In this state, the time information obtained from the time counting circuit 43 is coupled through the display selection circuit 44 to the display section 45, so that the present time data, for instance "20, SUN, 12:58 30", is displayed. In this state of display of the present time information, by operating the switch $S_3$ the one-shot circuit 49 produces a one-shot pulse signal to increase the content of the display selection counter 50 by one-step, i.e., set the content to "1". As a result, the "1" count signal is supplied from the display selection counter 50 to the display selection circuit 44. Thus, the preset time alarm data memorized in the time alarm circuit 46 is coupled through the display selection circuit 44 to the display section 45 and displayed thereon. Likewise, by setting the content of the display selection counter 50 to "2", the preset weekly alarm information memorized in the weekly alarm circuit 47 is coupled through the display selection circuit 44 to the display section 45 for display, and by setting the content of the display selection counter 50 to "3" the preset calendar alarm information memorized in the calendar alarm circuit 48 is coupled to the display section 45 for display.

Now, the use of this embodiment in case when the alarm time preset in the time alarm circuit 46 is scheduled for "phone", the alarm time preset in the weekly alarm circuit 47 is scheduled for "waiting for Mr. A for meeting" and the alarm time preset in the calendar alarm circuit 48 is scheduled for "prearrangements" will be described. The voice "phone" is the shortest among the three voice messages mentioned above, so that it is recorded by selecting the recording memory section 60 having the least memory capacity among the recording memory sections 58 to 60. In the state where the time alarm data is being displayed, the AND gate 67 in the selection control section 53*a* in the recording memory section selection circuit 53 is held open by the "1" count signal produced from the display selection counter 50. In this state, by operating the switch $S_4$ a one-shot pulse signal is coupled from the one-shot circuit 51 through the AND gate 67 to the 3-step counter 68 to cause stepwise increase of the content thereof. In this way, the "0" to "2" count signals are successively produced from the 3-step counter 68 with the stepwise increase of the content thereof, and these signals are coupled as the display drive signals $D_1$ to the recording capacity display section 73 in the display section 45. When the "0" count signal is produced from the 3-step counter 68, the bar-like display element 73*a* is driven for display. Likewise, with the "2" count signal the display element 73*b* is driven, and with the "3" count signal the display element 73*c* is driven. When the bar-like display element 73*c* is driven for display as shown in FIG. 6, it is shown that the recording memory section 60 having the least recording capacity is being selected for the time alarm circuit 46. In this state, by operating the switch $S_5$ a one-shot pulse signal is coupled from the one-shot circuit 52 to the decoder 69, causing the decoder 69 to produce the selection signal $A_3$. The selection signal $A_3$ thus produced is coupled to the address section 56 to cause the address section 56 to supply first address data to the recording memory section 60. The fact that the first address of the recording memory section 60 is specified means that this recording memory section 60 is selected. Meanwhile, the output signal from the switch $S_5$ is also coupled as operation command signal R to the A/D converter 61 and encoder 62, that is, these circuits are held operative so long as the switch $S_5$ is being operated. In this state, by pronouncing the voice "phone" to the microphone 63 within about one second from the establishment of this state, the voice signal coupled from the microphone 63 is converted through the A/D converter 61 into a corresponding digital voice signal and then encoded through the encoder 62, and the output thereof is written in the recording memory section 60.

The voice "waiting for Mr. A for meeting", which is scheduled at a preset alarm time on a preset weekday, is the longest among the three voices mentioned above, so that it is recorded by selecting the recording memory section 58 having the largest recording capacity among the recording memory sections 58 to 60. In the state where the weekly alarm data is being displayed in the presence of the "2" count signal from the display selection counter 50, this "2" count signal is also coupled to the selection control section 53*b*. In this state, by operating the switch $S_4$ the selection control section 53*b* is caused to make selection of the recording memory sections, while supplying the successive display drive signals $D_2$ to the recording capacity display section 74 in the display section 45 for the successive display of the bar-like display elements 74*a* to 74*c*. When the bar-like display element 74*a* is displayed as shown in FIG. 6, it is shown that the recording memory section 58 having the greatest recording capacity is being selected for the weekly alarm circuit 47. In this state, i.e., in the state where the weekly alarm data and bar-like display element 74*a* are displayed, by operating the switch $S_5$ the selection signal $A_1$ is produced from the selection control section 53*b* and coupled to the address section 54 to cause the address section 54 to produce first address data. Thus, the first address of the recording memory section 58 is specified to select this recording memory section 58. In this state, by pronouncing the voice "waiting for Mr. A for meeting" to the microphone 63 within about 3 seconds from the establishment of this state, it is recorded in the recording section 58.

For recording the voice "prearrangements" which is scheduled at an alarm time on a preset data memorized in the calendar alarm circuit 8, the recording memory section 59 is selected this time by similarly operating the switch $S_4$, and by pronouncing this voice to the microphone while the switch $S_5$ is being operated, it is recorded in the recording memory section 19.

When the preset alarm time memorized in the time alarm circuit 46 is reached, the alarm signal $C_1$ is produced therefrom and coupled to the selection control section 53*a* and also coupled as operation command signal to the decoder 64 and voice signal synthesis circuit 65. Also, since the 3-step counter 68 in the selection control section 53*a* has been set to "2", the selection signal $A_3$ is produced therefrom to cause the address section 56 to produce the first address data. As a result, the first address of the recording section 60, in which the voice data for "phone" has been memorized, is specified, and the voice data is successively read out from the recording memory section 60. The voice data thus read out is decoded through the decoder 64 for coupling to the voice signal synthesis circuit 65 to produce voice signal, whereby the recorded voice is reproduced from the loudspeaker 66. Thus, the user can hear the reproduced voice "phone" as alarm sound at the preset alarm time.

When the preset time on the preset weekday memorized in the weekly alarm circuit 47 is reached, the alarm signal $C_2$ is produced therefrom and coupled to the selection control section 53*b* and also coupled as operation command signal to the decoder 64 and voice signal synthesis circuit 65. Thus, the selection signal $A_1$ is produced from the selection control section 53*b* to select the recording memory section 58 and reproduce the recorded voice "waiting for Mr. A for meeting".

When the preset time on the preset date memorized in the calendar alarm circuit 48 is reached, the alarm signal $C_3$ is produced therefrom, thus causing the selection control section 53*c* to produce the selection signal $A_2$ for selecting the recording memory section 53*c* and reproducing the recorded voice "prearrangements".

It is to be appreciated that the arrival of a preset time on everyday, a preset time on a given weekday and a preset time on a given date, respectively memorized in the alarm circuits 46 to 48, the corresponding recorded voices telling what have to be done are produced as alarm sound.

While in the above embodiments, voices telling what have to be done for three different alarm times can be recorded, it is also possible to permit recording of voices telling what have to be done for two different alarm times and cause a given piece of music or monotone sound to be produced for the remaining alarm time.

Also, it is possible to permit selection of recorded voice or piece of music for reproduction at the arrival of an alarm time.

As has been described in the foregoing, according to the invention externally coupled voices can be recorded in a plurality of recording memory sections which are selected for respective alarm function sections and reproduced at the time of the action of these alarm function sections. Thus, it is possible to hear the reproduction of a desired voice at the arrival of an alarm time. In addition, since the individual recording memory sections are constructed to have different recording capacities and adapted to be selectively used depending upon the length of the voices to be recorded, it is possible to reliably record a comparatively long voice as well as a short voice without need of unnecessarily increasing the recording capacity.

What we claim is:

1. An electronic timepiece having recording function comprising:

a time counting means for producing time information through the counting of a reference frequency signal;

time display means for displaying said time information produced from said time counting means;

alarm time memory means including a plurality of memory sections for memorizing different alarm times;

first operation switch means for selecting one of the different alarm times stored in said alarm time memory means;

alarm time display means coupled to said first operation switch means for displaying the alarm time selected by the operation of said first operation switch means;

semiconductor memory means having a plurality of memory sections each adapted to be selected for cooperation with a desired one of said memory sections of said alarm time memory means, said memory sections of said semiconductor memory means being each capable of storing voice data of an externally coupled voice;

second operation switch means for enabling writing voice data in each of said memory sections of said semiconductor memory means;

voice data writing control means coupled to said second operation switch means and to said semiconductor memory means for writing said voice data of an externally coupled voice into memory sections of said semiconductor memory means in response to the operation of said second operation switch means, said voice data writing control means including conversion means for converting an externally coupled voice input into voice data, supply means coupled to said conversion means for supplying operation order signals to said conversion means in response to the operation of said second operation switch means, and selection and indication means coupled to said second operation switch means for selecting and indicating the memory section corresponding to an alarm time displayed on said alarm time display means,in response to the operation of said second operation switch means; and voice reproducing means coupled to said semiconductor memory means for reading out voice data stored in one of the memory sections of said semiconductor memory means and reproducing the corresponding recorded voice when said time information obtained from said time counting means coincides with an alarm time stored in a corresponding one of the memory sections of said alarm time memory means.

2. The electronic timepiece of claim 1, where said plurality of memory sections of said semiconductor memory means have different memory capacities.

3. The electronic timepiece of claim 1, further comprising a display means for displaying the memory capacities of said plurality of memory sections of said semiconductor memory means.

* * * * *